(12) United States Patent
Saito

(10) Patent No.: US 7,044,731 B2
(45) Date of Patent: May 16, 2006

(54) HEAT TREATMENT APPARATUS

(75) Inventor: Yukimasa Saito, Shiroyama-Machi (JP)

(73) Assignee: Tokyo Electron Limited, Tokyo-To (JP)

(*) Notice: Subject to any disclaimer, the term of this patent is extended or adjusted under 35 U.S.C. 154(b) by 99 days.

(21) Appl. No.: 10/485,155

(22) PCT Filed: Mar. 20, 2002

(86) PCT No.: PCT/JP02/02711

§ 371 (c)(1),
(2), (4) Date: Jan. 29, 2004

(87) PCT Pub. No.: WO03/012849

PCT Pub. Date: Feb. 13, 2003

(65) Prior Publication Data

US 2004/0175666 A1 Sep. 9, 2004

(30) Foreign Application Priority Data

Jul. 30, 2001 (JP) ......................... 2001-230315

(51) Int. Cl.
*F23J 17/00* (2006.01)

(52) U.S. Cl. .......................... 432/72; 432/152
(58) Field of Classification Search ............. 432/72, 432/152, 247, 241; 118/725
See application file for complete search history.

(56) References Cited

U.S. PATENT DOCUMENTS 5,088,922 A * 2/1992 Kakizaki et al. ............ 432/152
5,837,903 A * 11/1998 Weigand .................... 73/861.42
6,187,102 B1 * 2/2001 Yamamoto .................... 118/725
6,544,034 B1 * 4/2003 Watanabe .................... 432/200
2001/0029889 A1 10/2001 Holcomb et al.
2004/0007186 A1 1/2004 Saito

FOREIGN PATENT DOCUMENTS

| EP | 1 357 582 | 10/2003 |
|---|---|---|
| JP | 63-210501 | 9/1988 |
| JP | 05-013544 | 1/1993 |
| JP | 2001-201263 | 7/2001 |
| WO | WO 01/71781 | 9/2001 |

OTHER PUBLICATIONS

International Preliminary Examination Report (PCT/IPEA/409) (translated) issue for PCT/JP2002/002711.

Notification of Transmittal of Copies of Translation of the International Preliminary Examination Report (PCT/IB/338) issued for PCT/JP2002/002711.

* cited by examiner

*Primary Examiner*—Gregory Wilson
(74) *Attorney, Agent, or Firm*—Smith, Gambrell & Russell, LLP

(57) ABSTRACT

Exhaust pressure in an exhaust system 15 that evacuates a processing furnace 2 is determined as absolute pressure by using a differential manometer 23, which measures the exhaust pressure as differential pressure, and a barometer, which measures atmospheric pressure as absolute pressure. An opening of a pressure regulating valve 25 is adjusted based on the absolute exhaust pressure thus determined so that pressure in the processing furnace 2 is regulated.

11 Claims, 4 Drawing Sheets

HEAT TREATMENT APPARATUS

BACKGROUND OF THE INVENTION

1. Field of the Invention

The present invention relates to a heat treatment system, and more particularly, to a pressure control in a processing furnace.

2. Description of the Related Art

A method of manufacturing a semiconductor device includes, as an example of a heat treatment, an oxidation treatment by which an oxide film is formed on a surface of a semiconductor wafer. In one example of the oxidation treatment, a semiconductor wafer is brought into contact with water vapor at a predetermined temperature in a processing furnace so as to oxidize the semiconductor wafer (wet oxidation). A system for wet oxidation treatment is disclosed in Japanese Patent Laid-Open Publication No. JP 63-210501 A. The system includes a combustion unit arranged outside a processing furnace to generate water vapor by reacting hydrogen gas with oxygen gas. The water vapor thus generated by the combustion unit is supplied to the processing furnace to perform a heat treatment.

Such a heat treatment system may have an exhaust system which is connected to a factory exhaust system of slightly reduced pressure. In order to evacuate a processing furnace to a predetermined pressure, the heat treatment apparatus includes the exhaust system provided with an exhaust pressure control valve of a butterfly type or an exhaust pressure control valve whose opening is adjusted by a stepping motor and a spring. Exhaust pressure in the exhaust system is controlled by adjusting the opening of the control valve based on pressure measured by a differential manometer arranged in the exhaust system.

In the event that the exhaust pressure control valve is of a butterfly type, since a water film is formed between the valve element and a pipe because of condensation of water vapor, control of the opening of the valve tends to be unstable. In order to prevent this, an air-inlet port must be arranged upstream or downstream of the valve. In the event that the exhaust pressure control valve is of a type whose opening is adjusted by a stepping motor and a spring, an inert gas must be introduced to the valve for achieving smooth valve operation and a stable pressure control, which complicates the valve structure.

In the event that the opening of the valve is controlled based only on pressure measured by the differential manometer, when atmospheric pressure changes due to change of the weather, pressure in a processing furnace also varies. This results in variation in the oxide film thickness. In recent years, there has been required to form a quite thin film, and the tolerance range of the film thickness has been strictly limited. Thus, variation in film thickness, which was negligible in the past, becomes a critical problem.

Moreover, the differential manometer is intentionally configured so that a zero-point adjustment is impossible, because it is used for measuring a slight differential pressure. Thus, when the differential manometer is used for a long time, it is difficult to maintain its measuring accuracy.

SUMMARY OF THE INVENTION

The present invention is made taking the above circumstances into consideration, and therefore an object of the present invention is to provide a heat treatment apparatus of a simple structure which achieves high degree of film-thickness reproducibility for a long time.

In order to attain the object, the present invention provides a heat treatment system including: a processing furnace that accommodates a workpiece therein; a process gas supply system that supplies a process gas into the processing furnace; a heater that heats the processing furnace; an exhaust system that evacuates the processing furnace and has an exhaust passage; exhaust pressure regulating apparatus that regulates exhaust pressure in the exhaust passage; a differential manometer that measures exhaust pressure in the exhaust passage expressed as differential pressure with respect to atmospheric pressure; a barometer that measures atmospheric pressure expressed as absolute pressure; and a controller that controls the exhaust pressure regulating apparatus based on exhaust pressure expressed as absolute pressure, which is evaluated based on the exhaust pressure measured by the differential manometer and the atmospheric pressure measured by the barometer.

Preferably, a pressure regulating valve is used as the exhaust pressure regulating apparatus.

In the event that the exhaust passage is connected to a factory exhaust system of slightly reduced pressure, an ejector is preferably arranged in the exhaust passage.

Alternatively, the exhaust pressure regulating apparatus may include an ejector and a regulator adapted to regulate a flow rate of a working air to be supplied to the ejector.

DESCRIPTION OF THE PREFERRED EMBODIMENTS

Embodiments of the present invention are described in detail with reference to the accompanying drawings.

Figure 1:
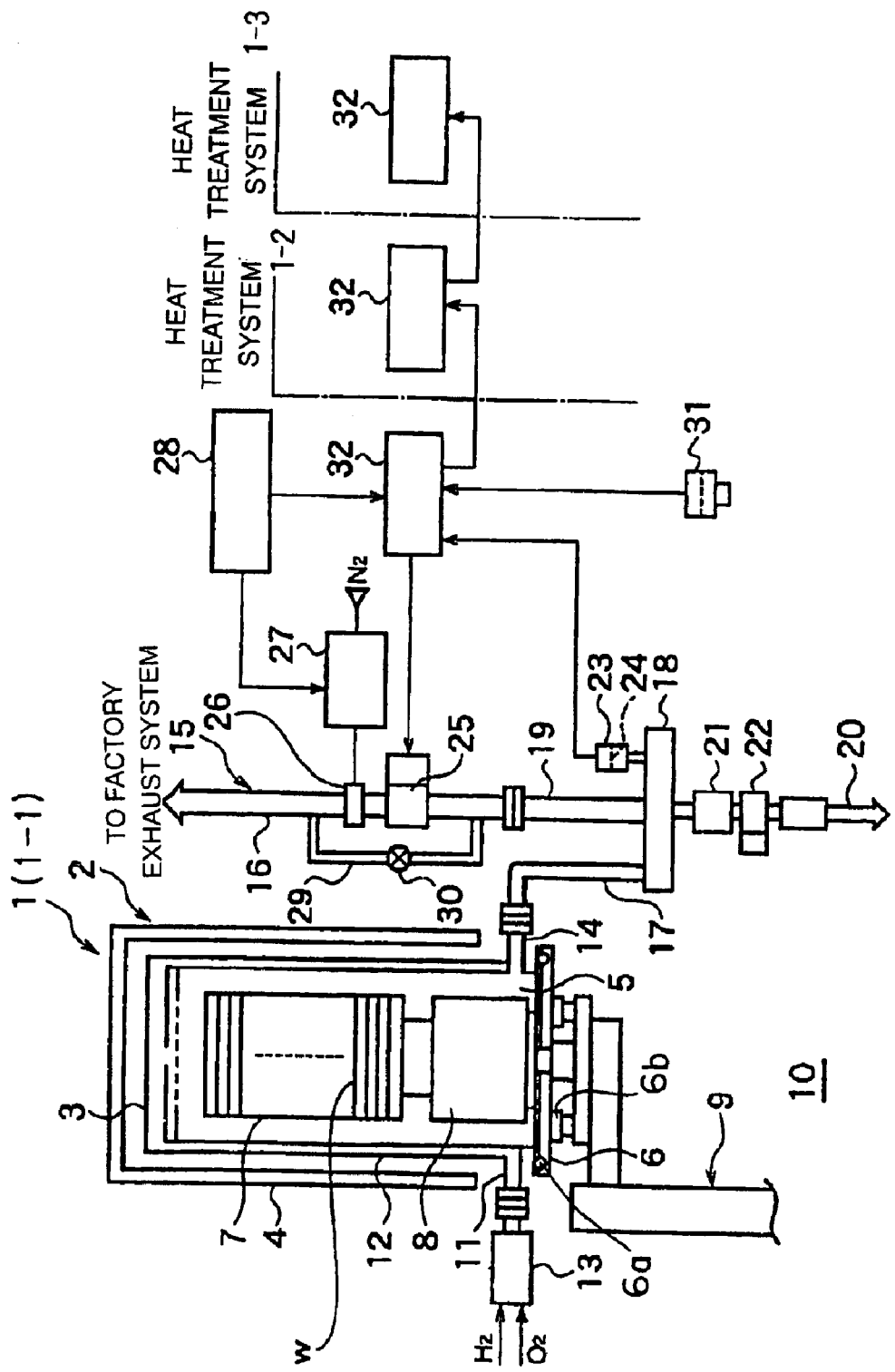
FIG. 1 shows a structure of a heat treatment apparatus in a first embodiment of the present invention.

In FIG. 1, the reference numeral 1 indicates a heat treatment system adapted to perform a thermal oxidation treatment. The heat treatment apparatus 1 includes a vertical processing furnace 2 of a batch type. After semiconductor wafers W are received in the processing furnace 2, a process gas is supplied into the furnace 2 to carry out a thermal oxidation treatment at a high temperature such as about 850° C. A moisture-containing gas (e.g., water vapor, or a mixed gas of water vapor and hydrogen chloride gas), or a gas that can react in the processing furnace 2 to generate moisture (e.g., a mixed gas of a hydrochloric gas and an oxygen gas) may be used as a process gas for a thermal oxidation treatment. The processing furnace 2 includes a processing vessel (reaction tube) 3 and a heater 4. The processing vessel 3 is made of heat-resistant quartz, and is formed in a vertically-elongated cylindrical shape having a closed upper end and an opened lower end. The heater 4 is arranged around the processing vessel 3, and is capable of heating the processing vessel 3 at a predetermined temperature such as between about 300° C. and 1000° C. Although FIG. 1 shows the processing vessel 3 of a double-tube structure, it may be of a single-tube structure.

The processing vessel 3 has a lower end opening 5 serving as a furnace throat. The lower end opening 5 is air-tightly closed by a lid 6. A boat 7 made of quartz is mounted on the lid 6 through means for thermally insulating the furnace throat, e.g., an insulator tube 8. The boat 7 horizontally holds a multiplicity of, for example, 150 pieces of semiconductor wafers W, with the wafers being vertically spaced at intervals. The lid 6 can be vertically moved by an elevating mechanism 9.

A loading area 10 as a work area is located below the processing furnace 2. In the loading area 10, the boat 7 is mounted on the lid 6, and is removed from the lid 6.

A plurality of gas inlet ports 11 (only one of them is shown in FIG. 1) are arranged at a lower part of the processing vessel 3. A gas supplied from each of the gas inlet ports 11 into the processing vessel 3 passes a gas passage 12, which is defined between outer and inner tubes of the processing vessel 3, toward a top of the processing vessel 3. Then, the gas is introduced into the inner tube of the processing vessel 3.

Connected to one of the gas inlet ports 11 is a water vapor generating unit 13 (means for supplying a process gas), which generates $H_2O$ (water vapor) by reacting $H_2$ gas with $O_2$ gas. Gas supply sources (not shown) are respectively connected to other gas inlet ports (not shown), for supplying other process gasses, such as NO gas, $CO_2$ gas, HCl gas, or an inert gas such as $N_2$. Through a catalytic reaction, the water vapor generating unit 13 generates water vapor by reacting hydrogen and oxygen. As compared with a conventional external combustion unit, the unit 13 can generate water vapor of high purity without containing particles or contaminations at a low reaction temperature.

An exhaust port 14 for evacuating the processing vessel 3 is arranged at a lower part of the processing vessel 3. An exhaust system 15 is connected to the exhaust port 14. The exhaust system 15 comprises a plurality of exhaust-passage-forming members. The exhaust-passage-forming members include a descending pipe 17, a duct 18 made of Teflon®, a water-cooled condenser pipe 19 which stands up from the duct 18, and an exhaust pipe 16. These members are sequentially connected to the exhaust port 14. Connected to a bottom of the duct 18A is a drain pipe 20, on which a drain tank 21 and a pneumatically controlled valve 22 are sequentially arranged. Moisture contained in an exhaust gas that is condensed in the condenser pipe 19 is lowered to the duct 18, and is discharged through the drain pipe 20 at suitable timings.

A differential manometer 23 is attached to the duct 18 to measure exhaust pressure in the exhaust system 15 expressed as differential pressure with respect to atmospheric pressure. The differential manometer 23 is configured, for example, to measure differential pressure in a range of ±13.3 kPa (±100 Torr), and to output a voltage in a range of from 0 to 10V, which corresponds to the measured pressure. The differential manometer 23 includes a diaphragm 24, on which a strain sensor (not shown) is attached. The strain sensor measures an amount of strain to outputs voltage corresponding thereto. Exhaust pressure in the exhaust system 15 is applied to one surface of the diaphragm 24, while atmospheric pressure is applied to the other surface thereof.

A zero-point adjustment of the differential manometer 23 is possible by opening the lid 6 to open the processing vessel 3 to an atmosphere. When closing a pressure-regulating valve 25 and a shut-off valve 30 (which will be described below) and opening the lid 6 to open the processing vessel 3 to an atmosphere, both surfaces of the diaphragm 24 are exposed to atmospheric pressure. Then, the differential manometer 23 outputs 5V, if appropriately adjusted. In this way, it is readily judged whether or not the differential manometer 23 is appropriately adjusted, based only on the output of the differential manometer 23. When the output of the differential manometer deviates from 5V, the zero-point adjustment (calibration) of the differential manometer 23 can be made by adjusting the output of the differential manometer 23 to 5V by means of an output adjustment knob (not shown) arranged on the differential manometer 23. Since the differential manometer 23 has a function of zero-point adjustment, a highly reliable pressure measurement can be performed for a long time.

The exhaust pipe 16 is preferably made of corrosion-resistant material such as Teflon®. A downstream end of the exhaust pipe 16 is connected to an exhaust duct of a factory exhaust system. Exhaust pressure in the factory exhaust system is slightly reduced, so that differential pressure of the exhaust pressure with respect to atmospheric pressure is −1330 Pa (−10 Torr), for example.

The pressure-regulating valve 25 is arranged on the exhaust pipe 16.

Figure 2:
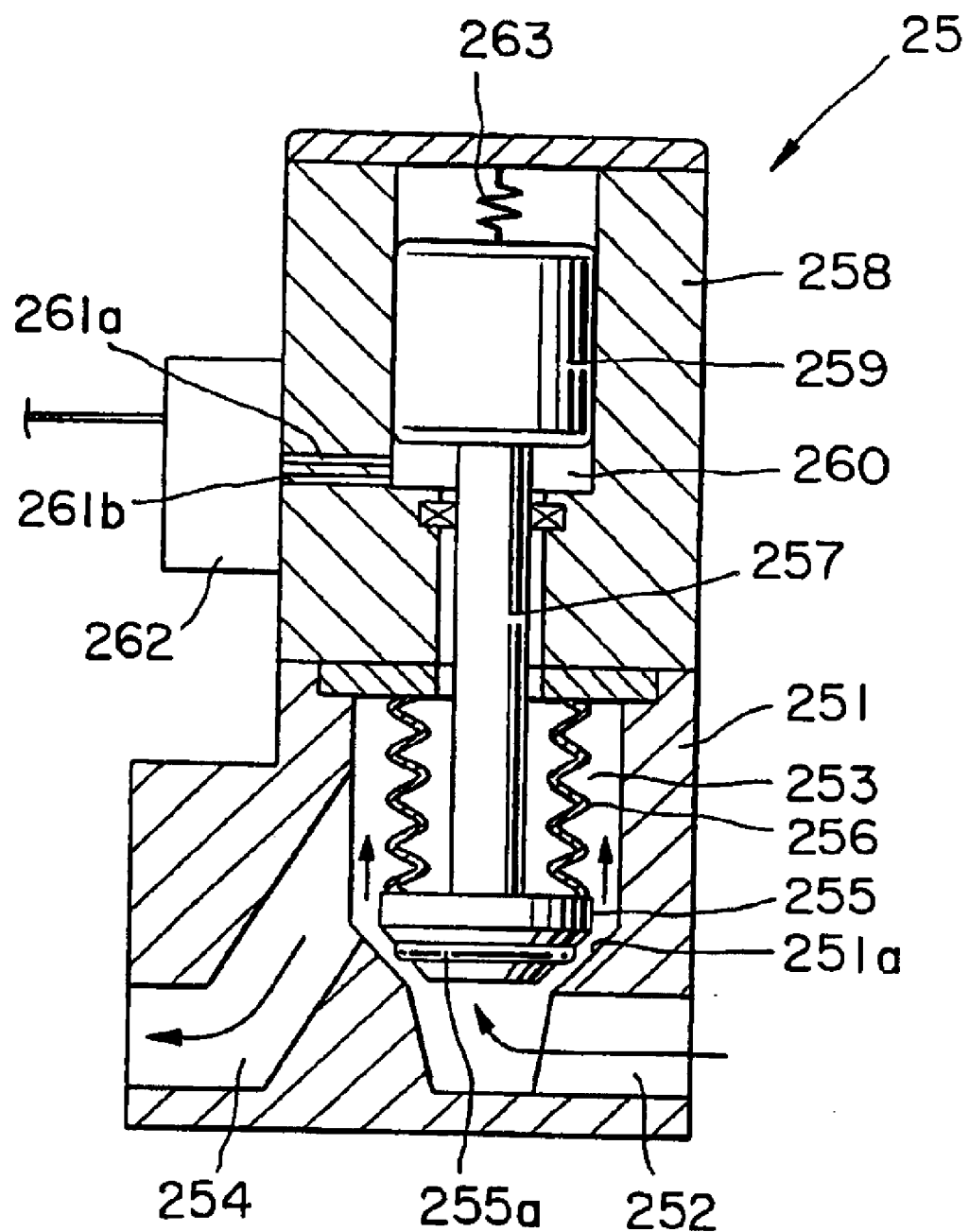
FIG. 2 schematically shows a structure of a pressure regulating valve.

As shown in FIG. 2, the pressure-regulating valve 25 includes a valve body 251. The valve body 251 has an inlet port 252 to which an exhaust gas is supplied from the processing vessel 3, a valve chamber 253 accommodating a valve element 255, and an exhaust port 254 connected to the factory exhaust system. A bellows 256 is provided to protect the component parts of the pressure regulating valve 25 located above the valve element 255 from a corrosive gas. A lower end of the bellows 256 is air-tightly connected to an upper surface of the valve element 255, and an upper end of the bellows 256 is air-tightly connected to a top wall of the valve chamber 253.

The valve element 255 is connected to a piston 259 disposed in a cylinder 258 through a rod 257. The cylinder 258 has an air-supply port 261a for supplying air to a space 260 in a cylinder chamber below the piston 259, and an exhaust port 261b for evacuating the space 260. An electro-pneumatic proportioning valve 262 controls pressure in the space 260 through the air-supply port 261a and the exhaust port 261b. The piston 259 is always urged downward by a spring 263, and is vertically moved according to the pressure in the space 260.

When the pressure-regulating valve 25 is fully closed, the valve element 255 is seated on a valve seat 251a. An O-ring 255a is attached to the valve element 255 to completely seal a gap between the valve element 255 and the valve seat 251a (to shut off the valve). The profile of the surface of the valve seat 251a is substantially complementary to that of the outer surface of the valve element 255, which is substantially of a truncated cone shape.

When a control signal from a controller 32 is inputted to the electro-pneumatic proportioning valve 262 of the pressure regulating valve 25, the electro-pneumatic proportioning valve 262 controls pressure in the space 260, and thus the position (the opening) of the valve member 255 is adjusted. Due to an orifice effect depending on the size of the gap between the valve element 255 and the valve seat 251a, exhaust pressure in the exhaust system 15 on the upstream side of the pressure-regulating valve 25, and thus pressure in the processing vessel 3, can be adjusted. Due to the structure of the pressure-regulating valve 25 as shown in FIG. 2, the opening of the valve 25 can be adjusted with high precision, and the pressure-regulating valve 25 has an excellent responsiveness. Due to the specific profiles of the valve element 255 and the valve seat 251a, if condensation of water vapor occurs, adhesion of the resultant water drops to an area where the valve member 255 contacts the valve seat 251a can be suppressed. Thus, the supply of air or an inert gas for preventing condensation is not necessary (however, it may be done). Accordingly, the overall structure of the exhaust system 15 is simplified, resulting in cost reduction.

In order to endure in an extremely corrosive environment, the surfaces of the differential manometer 23 and the pressure regulating valve 25 exposed to the gas are made of a non-metal, corrosion-resistant material, such as a corrosion-resistant resin, preferably, fluorocarbon resin.

Figure 3:
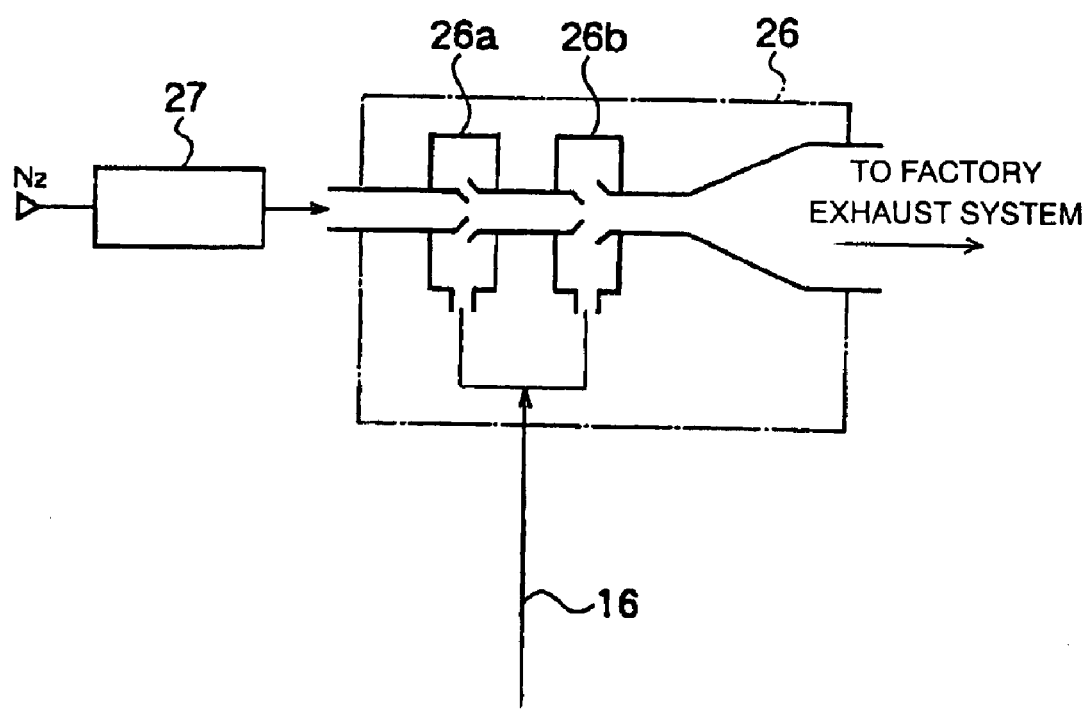
FIG. 3 shows a structure of an ejector.

Since a plurality of heat treatment systems 1 are connected to the factory exhaust system in general, the factory exhaust system does not have a sufficient suction performance, and pressure of the factory exhaust system fluctuates. In order to solve this problem, an ejector 26 is provided on the exhaust pipe 16 on the downstream side of the pressure-regulating valve 25. As shown in FIG. 3, the ejector 26 includes a plurality of (two) ejector members 26a and 26b which are serially arranged. On the upstream side of the ejector members 26a and 26b, the exhaust pipe 16 is branched into two pipes, which are respectively connected to the two ejector members 26a and 26b. Air or an inert gas such as $N_2$ gas is supplied to the first-stage ejector member 26a as a working gas through an electro-pneumatic regulator 27. Thus, the exhaust gas is sucked from the exhaust pipe 16 into the first-state ejector member 26a. The gas discharged from the first-state ejector member 26a is supplied to the second-stage ejector member 26b, and then the exhaust gas is sucked from the exhaust pipe 16 into the second-stage ejector member 26b. The gas discharged from the second-stage ejector member 26b is discharged to the factory exhaust system. By using such a multi-staged ejector 26, a higher exhaust ability that overcomes the fluctuation in atmospheric pressure can be achieved, with a reduced consumption of the working gas.

The electro-pneumatic regulator 27 regulates a flow rate of the working gas to achieve required exhaust pressure in the exhaust pipe 16 based on a control signal from a system controller 28. For example, when supplying air or nitrogen gas as a working gas to the ejector 26 at a flow rate of 40 liters per minute, a vacuum evacuation at a reduced pressure of −133 hPa (−100 Torr) with respect to atmospheric pressure can be performed. Since the flow rate of the working gas to be supplied to the ejector 26 is adjustable by using the electro-pneumatic regulator 27, an energy-saving heat treatment system can be provided.

A bypass pipe 29 provided with a shut-off valve 30 is connected to the exhaust pipe 16 to bypass the pressure regulating valve 25 and the ejector 26. The shut-off valve 30 is usually closed. However, if the pressure-regulating valve 25 is automatically closed upon a power failure, for example, the shut-off valve 30 is opened to discharge an inert gas such as a nitrogen gas supplied into the processing vessel 3.

The heat treatment system 1 further includes a barometer 31 which measures atmospheric pressure as absolute pressure. The barometer 31 is arranged at a location where the heat treatment system 1 is installed. Measurement signals sent from the differential manometer 23 and the barometer 31 are inputted to a controller (i.e., valve controller) 32. Based on the signals, the controller 32 corrects pressure measured by the differential manometer 23 (i.e., obtains absolute pressure of exhaust pressure), and then controls the pressure regulating valve 25 based on the measured pressure thus corrected such that a predetermined exhaust pressure in the exhaust system 15 (on the upstream side of the pressure regulating valve 25) is achieved.

Process pressure of the heat treatment system 1 is set by a not-shown operation panel of the system controller 28. The process pressure thus set is inputted to the controller 32 from the system controller 28. The system controller 28 is adapted to set the process pressure in a range of 904 to 1037 hPa (680 to 780 Torr), for example. The process pressure thus set is inputted to the controller 32 as a voltage signal of 0 to 5V. It is preferable that the barometer 31 is adapted to measure pressure in a range of 800 to 1100 hPa, for example, and to output a measured value as a voltage signal in a range of from 0 to 5V.

Herein, it is assumed that the pressure-regulating valve 25 is controlled based only on a signal measured by the differential manometer 23. It is also assumed that atmospheric pressure A at a location where the heat treatment system 1 is installed is 1010 hPa (760 Torr), and that process pressure B (set pressure) is set to be 931 hPa (700 Torr). In this case, the controller 32 determines exhaust pressure C in the exhaust system 15 on the upstream side of the pressure-regulating valve 25 by means of the differential manometer 23, and then controls the opening of the pressure-regulating valve 25 such that the exhaust pressure C coincides with the set pressure B. The differential manometer 23 measures the exhaust pressure C as a differential pressure (C-A) with respect to the atmospheric pressure A. During the heat treatment, if the atmospheric pressure A is varied to be 931 hPa (700 Torr) in accordance with change of weather such as an approach of an atmospheric low pressure system, pressure measured by the differential manometer 23 also varies. As exhaust pressure is controlled based on the varied pressure measured by the differential manometer 23, the thickness of an oxide film formed on a surface of the semiconductor wafer W varies.

In order to prevent the above, with the heat treatment system 1 according to the present invention, the barometer 31 measures the atmospheric pressure of 931 hPa (700 Torr) at the time, and then the controller 32 corrects the pressure measured by the differential manometer 23 based on the measurement signal sent from the barometer 31. The controller 32 controls the opening of the pressure-regulating valve 25 such that the exhaust pressure in the exhaust system 15 coincides with 931 hPa (700 Torr). Due to the aforementioned control based on absolute pressure of the exhaust pressure, exhaust pressure in the exhaust system 15 and thus pressure in the processing vessel 3 can be always maintained constant, regardless of change of weather, i.e., a change of barometric pressure. Therefore, desired thickness of the oxide film can assuredly be obtained.

Generally, in a factory manufacturing semiconductor devices, as schematically shown in FIG. 1, a plurality of heat treatment systems 1 (heat treatment system 1, system 1-2, system 1-3 . . . system 1-n) are installed. It is preferable that a single barometer 31 is shared by the plurality of heat treatment systems 1, and that the measurement signal of the barometer 31 is inputted to the controller 32 of each heat treatment system. As a result, it is possible to suppress or prevent the variation of the thickness of the films obtained by different heat treatment systems.

In the heat treatment system 1, it is preferable that connecting portions of pipes in the gas supply system and the exhaust system, and portions of the processing furnace closed by the lid are air-tightly connected by means of a sealing material, or preferably, an O-ring. FIG. 1 shows an embodiment in which a gap between the lid 6 and the processing vessel 3 is sealed by an O-ring 6a arranged on the lid 6. In this way, an air-tightness of the processing vessel 3 can be enhanced. When executing treatments other than a normal pressure treatment or a slightly reduced pressure treatment, that is, when executing a treatment performed under softly reduced pressure or softly positive pressure, for example, penetration of atmosphere and leakage of a gas into and from the processing vessel 3 can be prevented. In order to improve the sealing performance especially in the positive pressure treatments, a spring member is preferably arranged on a lower portion (e.g., a position indicated by the reference numeral 6b) of the lid 6. Thus, even when the O-ring 6a is fatigued to some degree, the sealed condition can be maintained.

Figure 4:
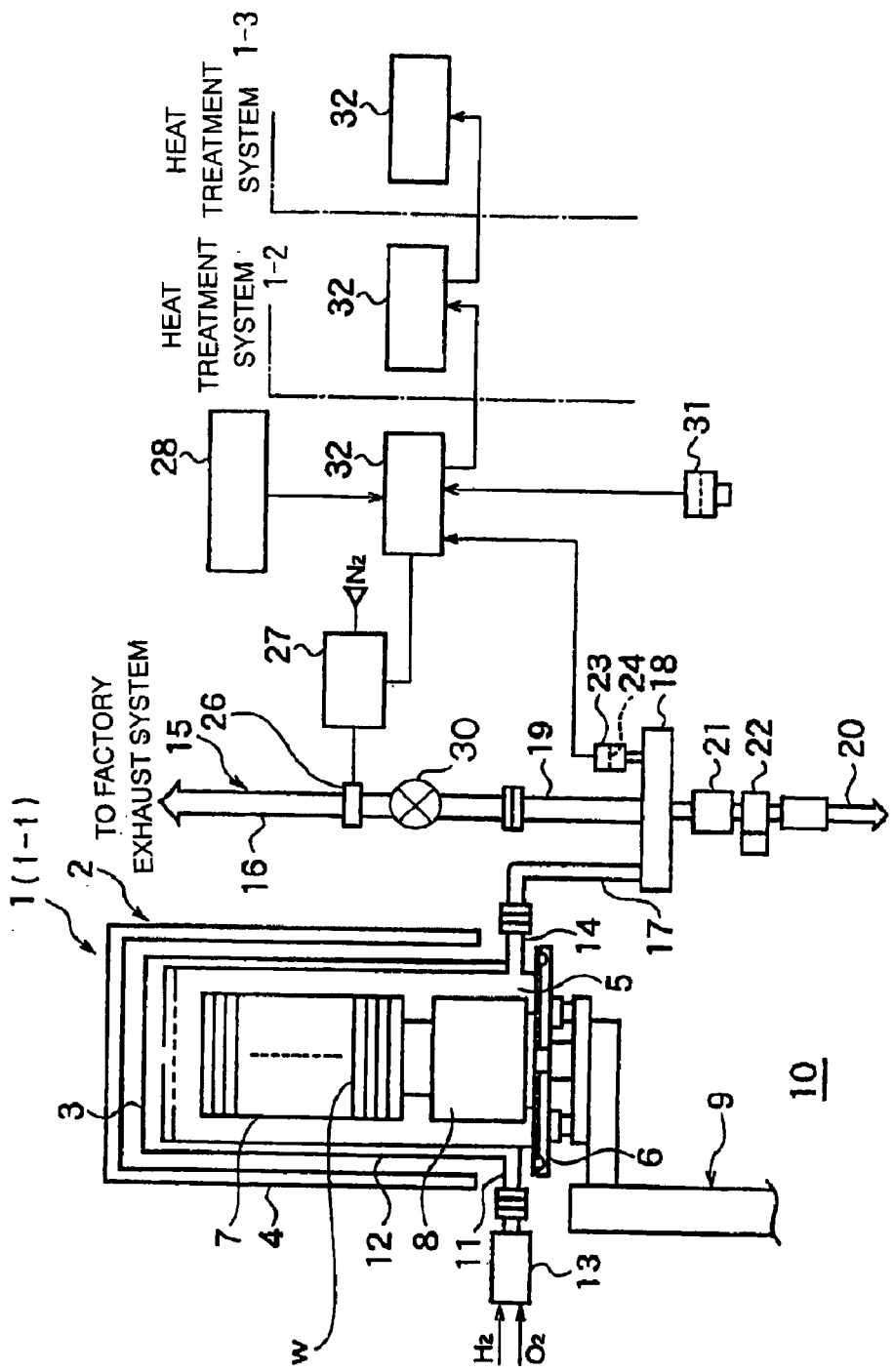
FIG. 4 shows a structure of a heat treatment apparatus in a second embodiment of the present invention.

The structure for controlling the exhaust pressure is not limited to that shown in FIG. 1. As shown in FIG. 4, exhaust pressure can be controlled only by the ejector 26 and the electric-pneumatic regulator 27, without using the pressure-regulating valve 25. In this case, the controller 32 controls the electric-pneumatic regulator 27 based on absolute exhaust pressure determined by the differential manometer 23 and the barometer 31 so as to control exhaust pressure.

Although embodiments of the present invention have been described above with reference to the drawings, the present invention is not limited thereto, and various changes and modifications are possible without departing from the scope of the invention. The processing furnace is not limited to a vertical type, but may be of a transverse type. Also, the processing furnace is not limited to a batch type, but may be a single substrate processing type. Other than the semiconductor wafer, the workpiece may be an LCD substrate, a glass substrate, and so on. The water vapor generating unit is not limited to a catalyst type, but may be a combustion type, a carburetor type, a boiler type, and so on. The heat treatment apparatus is not limited to such that performs the oxidation treatment. The heat treatment apparatus may be configured to perform a diffusion treatment, a CVD treatment, an annealing treatment, and so on.

What is claimed is:

1. A heat treatment system comprising:
    a processing furnace that accommodates a workpiece therein;
    a process gas supply system that supplies a process gas into the processing furnace;
    a heater that heats the processing furnace;
    an exhaust system that evacuates the processing furnace and has an exhaust passage;
    exhaust pressure regulating apparatus that regulates exhaust pressure in the exhaust passage;
    a differential manometer that measures exhaust pressure in the exhaust passage expressed as differential pressure with respect to atmospheric pressure;
    a barometer that measures atmospheric pressure expressed as absolute pressure; and
    a controller that controls the exhaust pressure regulating apparatus based on exhaust pressure expressed as absolute pressure, which is evaluated based on the exhaust pressure measured by the differential manometer and the atmospheric pressure measured by the barometer.

2. The heat treatment system according to claim 1, wherein the exhaust pressure regulating apparatus includes a pressure regulating valve adapted to control the exhaust pressure.

3. The heat treatment system according to claim 2, wherein the pressure regulating valve is configured so that the valve is capable of shutting off a flow of an exhaust in the exhaust passage.

4. The heat treatment system according to claim 2, further comprising an ejector that reduces the exhaust pressure.

5. The heat treatment system according to claim 1, wherein the exhaust pressure regulating apparatus includes an ejector and a regulator adapted to regulate a flow rate of a working gas to be supplied to the ejector.

6. The heat treatment system according to claim 1, wherein an ejector is arranged in the exhaust passage.

7. The heat treatment system according to claim 6, wherein the exhaust pressure regulating apparatus includes a pressure-regulating valve adapted to control the exhaust pressure.

8. The heat treatment system according to claim 1, wherein the differential manometer is configured so that zero-point adjustment of the manometer is possible upon opening the processing furnace to an atmosphere.

9. A set of heat treatment systems including a plurality of heat treatment systems as defined in claim 1, wherein a single barometer is shared by the plurality of heat treatment systems.

10. The heat treatment system according to claim 1, wherein the barometer is arranged as a unit separated from the differential manometer.

11. The heat treatment system according to claim 1, wherein the manometer includes a diaphragm having a first surface to which the atmospheric pressure is applied and a second surface to which the exhaust pressure is applied, whereby the differential manometer determines the differential pressure based on deformation of the diaphragm.

* * * * *